United States Patent
Song et al.

(10) Patent No.: US 11,315,963 B2
(45) Date of Patent: Apr. 26, 2022

(54) DISPLAY SUBSTRATE AND METHOD FOR PREPARING THE SAME, AND DISPLAY DEVICE

(71) Applicant: BOE TECHNOLOGY GROUP CO., LTD., Beijing (CN)

(72) Inventors: Zhen Song, Beijing (CN); Guoying Wang, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/915,142

(22) Filed: Jun. 29, 2020

(65) Prior Publication Data
US 2021/0005644 A1    Jan. 7, 2021

(30) Foreign Application Priority Data
Jul. 3, 2019    (CN) .......................... 201910593866.0

(51) Int. Cl.
*H01L 21/00* (2006.01)
*H01L 27/00* (2006.01)
(Continued)

(52) U.S. Cl.
CPC ...... *H01L 27/1274* (2013.01); *H01L 27/1225* (2013.01); *H01L 21/441* (2013.01)

(58) Field of Classification Search
CPC ... H01L 21/441; H01L 21/0278; H01L 21/02; H01L 21/0214; H01L 21/2181; H01L 21/02194; H01L 21/02274; H01L 27/1274; H01L 27/1225; H01L 27/3276; H01L 27/3246; H01L 27/3262; H01L 27/3244
See application file for complete search history.

(56) References Cited

U.S. PATENT DOCUMENTS 9,412,303 B2 * 8/2016 Kim ...................... G09G 3/325
9,911,762 B2 * 3/2018 Yan ................... H01L 29/78648
(Continued)

FOREIGN PATENT DOCUMENTS

CN     103295962 A    9/2013
CN     103715226 A    4/2014
(Continued)

OTHER PUBLICATIONS

First Office Action for Chinese Application No. 201910593866.0, dated Dec. 24, 2020, 10 Pages.

*Primary Examiner* — Nikolay K Yushin
(74) *Attorney, Agent, or Firm* — Brooks Kushman P.C.

(57) ABSTRACT

The present disclosure provides a display substrate, a method for preparing the same, and a display device. The method for preparing the display substrate includes a step of preparing a pixel driving circuit on a substrate, the step specifically includes: preparing a first active layer of an oxide transistor on the substrate; preparing a barrier layer on a surface of the first active layer away from the substrate, an orthogonal projection of the barrier layer on the substrate covering an orthogonal projection of the first active layer on the substrate; preparing a low-temperature polysilicon transistor is on the substrate; and preparing a first gate insulating layer, a first gate electrode, a first input electrode, and a first output electrode of the oxide transistor on the substrate.

20 Claims, 2 Drawing Sheets

(51) Int. Cl.
*H01L 27/12* (2006.01)
*H01L 21/441* (2006.01)

(56) References Cited

U.S. PATENT DOCUMENTS

| | | | |
|---|---|---|---|
| 10,431,668 B2 * | 10/2019 | Song | ............... H01L 21/0273 |
| 2015/0179679 A1 | 6/2015 | Im | |
| 2015/0371589 A1 * | 12/2015 | Kim | ............... H01L 27/1229 |
| | | | 345/208 |
| 2016/0049453 A1 | 2/2016 | Kang | |
| 2017/0162606 A1 * | 6/2017 | Yan | ............... H01L 29/78648 |
| 2017/0256569 A1 | 9/2017 | Ohara | |
| 2018/0175076 A1 | 6/2018 | Kim et al. | |
| 2019/0081159 A1 * | 3/2019 | Song | ............... H01L 29/42384 |
| 2019/0115373 A1 | 4/2019 | Lee | |
| 2019/0348449 A1 | 11/2019 | Gui et al. | |

FOREIGN PATENT DOCUMENTS

| | | | | |
|---|---|---|---|---|
| CN | 104934481 A | | 9/2015 | |
| CN | 107170747 A | | 9/2017 | |
| CN | 109244082 A | | 1/2019 | |
| CN | 109273404 A | | 1/2019 | |
| WO | WO 2018/099066 | * | 7/2018 | ........... H01L 21/336 |

* cited by examiner

DISPLAY SUBSTRATE AND METHOD FOR PREPARING THE SAME, AND DISPLAY DEVICE

CROSS-REFERENCE TO RELATED APPLICATION

This application claims priority to Chinese Patent Application No. 201910593866.0 filed on Jul. 3, 2019, which is incorporated herein by reference in its entirety.

TECHNICAL FIELD

The present disclosure relates to the field of display technology, in particular, to a display substrate, a method for preparing the same and a display device prepared by the method.

BACKGROUND

With the continuous development of display technology, people's requirements on the resolution, accuracy and image quality of display products get higher and higher. In order to meet these requirements, low-temperature polycrystalline oxide (LTPO) technology is often used to prepare the pixel driving circuit in the driving backplane of the display product. LTPO technology uses both low-temperature polysilicon thin-film transistors and metal oxide thin-film transistors as functional transistors in its driving circuit. The low-temperature thin-film transistor has a high mobility of transistors, which can accelerate the charging speed of the pixel capacitor. Metal oxide thin film transistors have a lower static leakage current. Combining the advantages of these two transistors will help the development of high-resolution, low-power, high-quality display products.

However, there is a problem that hydrogen diffuses into the active layer of the metal oxide thin film transistor during the preparation of the low-temperature polysilicon thin film transistor. In the step of preparing the active layer of the low-temperature polysilicon thin film transistor, a large amount of hydrogen needs to be introduced. The entire process of preparing the driving backplane further includes various high-temperature processes. When these high-temperature processes are carried out, it is easy to diffuse hydrogen into the active layer of the metal oxide thin film transistor. These lead to a reduction in the reliability of the driving backplane, and even lead to the direct failure of the produced driving backplane.

SUMMARY

In one aspect, the present disclosure provides a method for preparing a display substrate, including a step of preparing a pixel driving circuit on a substrate, the pixel driving circuit including an oxide transistor and a low-temperature polysilicon transistor, in which the step of preparing the pixel driving circuit on the substrate includes:

preparing a first active layer of the oxide transistor on the substrate;

preparing a barrier layer on a surface of the first active layer away from the substrate, in which an orthogonal projection of the barrier layer on the substrate covers an orthogonal projection of the first active layer on the substrate;

preparing the low-temperature polysilicon transistor on the substrate; and preparing a first gate insulating layer, a first gate electrode, a first input electrode, and a first output electrode of the oxide transistor on the substrate.

Optionally, the barrier layer and the substrate together enclose the first active layer.

Optionally, the preparing the barrier layer on the surface of the first active layer away from the substrate includes preparing the barrier layer using a metal material.

Optionally, the preparing the first gate insulating layer, the first gate electrode, the first input electrode, and the first output electrode of the oxide transistor on the substrate includes:

preparing an interlayer insulating layer completely covering the barrier layer on a surface of the barrier layer away from the substrate;

forming a first opening for exposing a part of the barrier layer on the interlayer insulating layer, in which the exposed barrier layer divides the unexposed barrier layer into a first portion and a second portion that are independent from each other, and the first portion and the second portion both cover a part of the first active layer;

oxidizing the exposed barrier layer to form the first gate insulating layer from the exposed barrier layer;

forming a first contact hole and a second contact hole in the interlayer insulating layer, in which the first contact hole exposes at least a part of the first portion, and the second contact hole exposes at least a part of the second portion; and preparing the first gate electrode, the first input electrode, and the first output electrode, in which the first gate electrode contacts the first gate insulating layer through the first opening, the first input electrode contacts the first portion through the first contact hole, and the first output electrode contacts the second portion through the second contact hole.

Optionally, the preparing the barrier layer on the surface of the first active layer away from the substrate includes preparing the barrier layer using a dense insulating material, in which the barrier layer is also reused as the first gate insulating layer.

Optionally, the preparing the first gate electrode, the first input electrode, and the first output electrode of the oxide transistor on the substrate includes:

preparing an interlayer insulating layer completely covering the barrier layer on a surface of the barrier layer away from the substrate;

forming a first opening, a first contact hole, and a second contact hole in the interlayer insulating layer, in which the first opening exposes a part of the barrier layer, the exposed part of the barrier layer divides the unexposed barrier layer into a first portion and a second portion that are independent from each other, and both the first portion and the second portion cover the first active layer, and in which the first contact hole penetrates through the interlayer insulating layer and the first portion of the barrier layer and exposes a part of the first active layer, and the second contact hole penetrates through the interlayer insulating layer and the second portion of the barrier layer and exposes a part of the first active layer; and preparing the first gate electrode, the first input electrode, and the first output electrode, in which the first gate electrode contacts the first gate insulating layer through the first opening, the first input electrode contacts the first active layer through the first contact hole, and the first output electrode contacts the first active layer through the second contact hole.

Optionally, the preparing the low-temperature polysilicon transistor on the substrate includes:

preparing a second active layer arranged in a same layer as the first active layer;

preparing a second gate insulating layer on a surface of the second active layer away from the substrate, and preparing a second gate electrode on a surface of the second gate insulating layer away from the substrate, in which an orthogonal projection of the second gate electrode on the second active layer divides the second active layer into a third portion and a fourth portion that are independent from each other;

extending the interlayer insulating layer to completely cover the second active layer when preparing the interlayer insulating layer;

simultaneously preparing the third contact hole and the fourth contact hole in the process of preparing the first contact hole and the second contact hole, in which the third contact hole exposes at least a part of the third portion, and the fourth contact hole exposes at least a part of the fourth portion;

simultaneously preparing the second input electrode and the second output electrode in the process of preparing the first gate electrode, the first input electrode, and the first output electrode, in which the second input electrode contacts the third portion through the third contact hole, and the second output electrode contacts the fourth portion through the fourth contact hole.

Optionally, the step of preparing the second gate insulating layer and the second gate electrode includes:

forming a second gate insulating thin film;

forming a conductive material thin film on a surface of the second gate insulating thin film away from the substrate;

patterning the conductive material thin film to form the second gate electrode; and etching the second gate insulating thin film using the second gate electrode as a mask plate, to form the second gate insulating layer.

In another aspect, the present disclosure provides a display substrate including a substrate and a pixel driving circuit arranged on the substrate, the pixel driving circuit including an oxide transistor and a low-temperature polysilicon transistor;

in which the oxide transistor includes a first active layer, a first gate insulating layer, a first gate electrode, a first input electrode, a first output electrode, and a barrier layer arranged on a surface of the first active layer away from the substrate, and an orthogonal projection of the barrier layer on the substrate covers an orthogonal projection of the first active layer on the substrate.

Optionally, the barrier layer, the gate insulating layer and the substrate together enclose the first active layer.

Optionally, the oxide transistor further includes an interlayer insulating layer completely covering the barrier layer, in which the interlayer insulating layer is provided with a first opening, an orthogonal projection of the first opening on the substrate overlaps with an orthogonal projection of a part of the barrier layer on the substrate, the part of the barrier layer divides the rest of the barrier layer into a first portion and a second portion that are independent from each other, both the first portion and the second portion cover a part of the first active layer, and the part of the barrier layer includes a metal oxide pattern, and is capable of being reused as the first gate insulating layer, and the rest of the barrier layers includes a metal pattern;

in which a first contact hole and a second contact hole are further arranged in the interlayer insulating layer, an orthogonal projection of the first contact hole on the substrate overlaps an orthogonal projection of at least a part of the first portion on the substrate, an orthogonal projection of the second contact hole on the substrate overlap an orthogonal projection of at least a part of the second portion on the substrate;

in which the first gate electrode contacts the first gate insulating layer through the first opening, the first input electrode contacts the first portion through the first contact hole, and the first output electrode contacts the second portion through the second contact hole.

Optionally, the oxide transistor further includes an interlayer insulating layer completely covering the barrier layer, in which the interlayer insulating layer is provided with a first opening, an orthogonal projection of the first opening on the substrate overlaps with an orthogonal projection of a part of the barrier layer on the substrate, the part of the barrier layer divides the rest of the barrier layer into a first portion and a second portion that are independent from each other, both the first portion and the second portion cover a part of the first active layer, and the barrier layer includes a dense insulating pattern, and is capable of being reused as the first gate insulating layer;

in which a first contact hole and a second contact hole are further arranged in the interlayer insulating layer, the first contact hole penetrates through the interlayer insulating layer and the first portion of the barrier layer, and the second contact hole penetrates through the interlayer insulating layer and the second portion of the barrier layer;

in which the first gate electrode contacts the first gate insulating layer through the first opening, the first input electrode contacts the first active layer through the first contact hole, and the first output electrode contacts the first active layer through the second contact hole.

Optionally, the low-temperature polysilicon transistor includes:

a second active layer arranged in a same layer as the first active layer;

a second gate insulating layer arranged on a surface of the second active layer away from the substrate; and a second gate electrode arranged on a surface of the second gate insulating layer away from the substrate, in which an orthogonal projection of the second gate electrode on the second active layer divides the second active layer into a third portion and a fourth portion that are independent to each other;

an interlayer insulating layer extending from the interlayer insulating layer to completely cover the second active layer, in which a third contact hole and a fourth contact hole are further arranged in the interlayer insulating layer, an orthogonal projection of the third contact hole on the substrate overlaps an orthogonal projection of at least a part of the third portion on the substrate, and an orthogonal projection of the fourth contact hole on the substrate overlap an orthogonal projection of at least a part of the fourth portion on the substrate; and a second input electrode and a second output electrode, in which the second input electrode contacts the third portion through the third contact hole, and the second output electrode contacts the fourth portion through the fourth contact hole.

Optionally, an orthogonal projection of the second gate insulating layer on the substrate coincides with an orthogonal projection of the second gate electrode on the substrate.

Optionally, the low-temperature polysilicon transistor is used as a driving transistor in the pixel driving circuit, and the oxide transistor is used as a switching transistor in the pixel driving circuit.

In yet another aspect, the present disclosure provides a display device, including the display substrate provided by the above embodiment.

DETAILED DESCRIPTION

In order to further illustrate the display substrate, the method for preparing the same and the display device provided according to the embodiments of the present disclosure, the present disclosure will be described in detail hereinafter in conjunction with the drawings.

An object of the present disclosure is to provide a display substrate, a method for preparing the same, and a display device including the display substrate. The method solves the problem that when the LTPO technology is used to prepare the pixel driving circuit, the hydrogen introduced by the preparation of the low-temperature polysilicon thin film transistor easily affects the active layer of the metal oxide thin film transistor, resulting in a reduction in the reliability of the driving backplane. Furthermore, the display substrate or display device of the present disclosure has an excellent display effect.

In the related art, when a low-temperature polysilicon thin film transistor is prepared, the gas used has a high silane content, and thus a large amount of hydrogen is introduced when preparing a pixel driving circuit in a display substrate. Moreover, during the preparation process of the pixel driving circuit, high temperature processes, such as annealing and chemical vapor deposition, are performed, and hydrogen easily diffuses into the active layer of the metal oxide thin film transistor. These lead to a reduction in the reliability of the driving backplane, and even lead to the direct failure of the produced driving backplane.

The inventor of the present disclosure has found through deep research that the above technical problems can be solved by the following preparation method, that is, first preparing an active layer in a metal oxide thin film transistor, covering the active layer with a barrier layer, and then preparing a low-temperature polysilicon thin film transistor. This method prevents hydrogen from adversely affecting the active layer of the metal oxide transistor. The specific technical solutions of the preparation method of the present disclosure are shown as follows.

Specifically, please refer to FIGS. 1a to 1d, an embodiment of the present disclosure provides a method for preparing a display substrate, including the step of preparing a pixel driving circuit on a substrate 10, the pixel driving circuit including an oxide transistor and a low-temperature polysilicon transistor, the step specifically including: preparing a first active layer 20 of the oxide transistor on the substrate 10; preparing a barrier layer 21 on a surface of the first active layer 20 away from the substrate 10, in which an orthogonal projection of the barrier layer 21 on the substrate 10 covers an orthogonal projection of the first active layer 20 on the substrate 10; preparing the low-temperature polysilicon transistor on the substrate 10; and preparing a first gate insulating layer 22, a first gate electrode 25, a first input electrode 23 and a first output electrode 24 of the oxide transistor on the substrate 10.

There are various types of the substrate 10 of the above display substrate. For example, the substrate may be a glass substrate. Optionally, before the first active layer 20 is prepared on the substrate 10, a film layer, such as a buffer film layer, may be formed on the substrate 10 first.

Optionally, when the first active layer 20 is prepared on the substrate 10, an active thin film is first deposited by using indium gallium zinc oxide (IGZO), and then the active thin film is patterned to form the first active layer 20. Optionally, after the first active layer 20 is prepared, a barrier layer 21 is prepared on a surface of the first active layer 20 away from the substrate 10, so that the barrier layer 21 can completely cover the first active layer 20. That is, the top surface and the side surface of the first active layer 20 are covered. Optionally, the barrier layer 21 and the substrate 10 together completely enclose the first active layer 20. An embodiment according to the present disclosure can prevent hydrogen from diffusing into the first active layer 20 in the subsequent high-temperature process.

After the barrier layer 21 is prepared, the rest part of the low-temperature polysilicon transistor and the oxide transistor can be continuously prepared. Specifically, after the barrier layer 21 is prepared, a low-temperature polysilicon transistor may be prepared first, and then the first gate insulating layer 22, the first gate electrode 25, the first input electrode 23, and the first output electrode 24 of the oxide transistor are prepared. Optionally, after the barrier layer 21 is prepared, a part of the low-temperature polysilicon transistor may be prepared first, and then the rest part of the low-temperature polysilicon transistor as well as the first gate insulating layer 22, the first gate electrode 25, the first input electrode 23 and the first output electrode 24 of the oxide transistor may be prepared simultaneously.

Notably, the first gate insulating layer 22 and the first gate electrode 25 included in the oxide transistor can also be prepared before the first active layer 20 layer and the barrier layer 21 are prepared, and the first input electrode 23 and the first output electrode 24 included in the oxide transistor may be prepared after the first active layer 20 and the barrier layer 21 are prepared.

In the method for preparing the display substrate according to an embodiment of the present disclosure, when the oxide transistor and the low-temperature polysilicon transistor included in the pixel driving circuit of the display substrate are prepared, the first active layer 20 of the oxide transistor is prepared first, a barrier layer 21 is prepared on the first active layer 20 of the oxide transistor, and then a low-temperature polysilicon transistor is prepared. This method prevents the hydrogen introduced during the preparation of the low-temperature polysilicon transistor from diffusing to the first active layer 20 of the oxide transistor in a high-temperature process, and avoids the hydrogen from adversely affecting the active layer in the metal oxide transistor, thereby well ensuring the reliability of the prepared display substrate.

There are various specific methods for preparing the barrier layer 21 according to the above embodiments. Two exemplary preparation methods are provided as follows, and when the barrier layer 21 are prepared by using different methods, the complete process of preparing the oxide transistor is described in details.

In some embodiments according to the present disclosure, the above step of preparing the barrier layer 21 may include preparing the barrier layer 21 using a metal material. Specifically, the barrier layer 21 may be made of a metal material. The metal material is a metal material that is easy to be oxidized, so as to facilitate subsequent preparation of the first gate insulating layer 22. For example, the metal materials used include metals that are easily to be oxidized, such as aluminum (Al), hafnium (Ha), and tantalum (Ta). A metal thin film may be deposited on a surface of the first active layer 20 away from the substrate 10, and then the metal thin film is patterned by using a mask plate, to form the barrier layer 21.

When the barrier layer 21 is made of a metal material, the above step of preparing the first gate insulating layer 22, the first gate electrode 25, the first input electrode 23, and the first output electrode 24 of the oxide transistor optionally includes: preparing an interlayer insulating layer 40 completely covering the barrier layer 21 on a surface of the barrier layer 21 away from the substrate 10; forming a first opening for exposing a part of the barrier layer 21 on the interlayer insulating layer 40, in which the exposed barrier layer 21 divides the unexposed barrier layer 21 into a first portion and a second portion that are independent from each other, both the first portion and the second portion cover a part of the first active layer 20; oxidizing the exposed barrier layer 21, to form the exposed barrier layer 21 into the first gate insulating layer 22; forming a first contact hole and a second contact hole in the interlayer insulating layer 40, in which the first contact hole exposes at least a part of the first portion, and the second contact hole exposes at least a part of the second portion; and preparing a first gate electrode 25, a first input electrode 23, and a first output electrode 24, in which the first gate electrode 25 contacts the first gate insulating layer 22 through the first opening, the first input electrode 23 contacts the first portion through the first contact hole, and the first output electrode 24 contacts the second portion through the second contact hole.

Specifically, after the barrier layer 21 is prepared, an interlayer insulating layer 40 may be formed on a surface of the barrier layer 21 away from the substrate 10 by plasma enhanced chemical vapor deposition. The interlayer insulating layer 40 should at least completely cover the barrier layer 21. Optionally, the interlayer insulating layer 40 may also cover the entire display substrate, so that it can be also used as the interlayer insulating layer 40 of other transistors included in the display substrate at the same time. After the interlayer insulating layer 40 is formed by deposition, the interlayer insulating layer 40 may be patterned, to form a first opening in the interlayer insulating layer 40. The first opening can expose a part of the barrier layer 21, and the exposed barrier layer 21 can divide the unexposed barrier layer 21 into a first portion and a second portion that are independent from each other. Both the orthogonal projection of the first portion on the substrate 10 and the orthogonal projection of the second portion on the substrate 10 partially overlap the orthogonal projection of the first active layer 20 on the substrate 10.

After the first opening is formed on the interlayer insulating layer 40, the exposed barrier layer 21 may be oxidized through the first opening, that is, the exposed barrier layer 21 is changed from a metal material to a metal oxide material. The oxidized barrier layer may serve as the first gate insulating layer 22 in the oxide transistor. Optionally, the above oxidation process may be selected from oxygen ion bombardment, anodization and other oxidation processes, but it is not limited thereto.

Then, it may continue to form the first contact hole and the second contact hole in the interlayer insulating layer 40. Both the first contact hole and the second contact hole can penetrate through the interlayer insulating layer 40, the first contact hole exposes at least a part of the first portion, and the second contact hole exposes at least a part of the second portion. Then, it may continue to prepare the first gate electrode 25, the first input electrode 23, and the first output electrode 24. Optionally, a conductive film layer may be deposited on the surface of the interlayer insulating layer 40 away from the substrate 10, the conductive film layer covering the surface of the interlayer insulating layer 40 away from the substrate 10, and filled in the first contact hole, the second contact hole and the first opening. Then, the conductive film layer is patterned once, and the first gate 25, the first input electrode 23 and the first output electrode 24 are formed at the same time. The first gate electrode 25 can contact the first gate insulating layer 22 through the first opening, the first input electrode 23 can contact the first portion through the first contact hole, and the first output electrode 24 can contact the second portion through the second contact hole.

The above methods for preparing the barrier layer 21 and for the first insulating layer, the first gate electrode 25, the first input electrode 23, and the first output electrode 24 not only avoid the influence of hydrogen on the first active layer 20, but also simplify the process flow for preparing the oxide transistor and make the structure of the prepared oxide transistor simple.

Optionally, the above step of preparing the barrier layer may also include using a dense insulating material to prepare the barrier layer, in which the barrier layer is reused as the first gate insulating layer.

Specifically, an insulating material with a preset density can be used to prepare the barrier layer, and the preset density can be selected according to actual needs, as long as it can block the passage of hydrogen. For example, the density of the insulating material for preparing the barrier layer is 0.5 or more, and may be 0.6 or more, 0.65 or more, 0.70 or more, or 0.75 or more. For example, materials, such as silicon oxide and silicon nitride, can be used to make the barrier layer. When the above insulating material is used to prepare the barrier layer, an insulating thin film may be deposited on a surface of the first active layer 20 away from the substrate 10, and then the insulating thin film may be patterned by using a mask plate, to form the barrier layer. Since the barrier layer covers the first active layer 20 and has insulating properties, the barrier layer can be also reused as the first gate insulating layer.

When an insulating material with a predetermined density is used to prepare the barrier layer, the step of preparing the first gate electrode, the first input electrode, and the first output electrode of the oxide transistor includes:

preparing an interlayer insulating layer completely covering the barrier layer on a surface of the barrier layer away from the substrate;

forming a first opening, a first contact hole, and a second contact hole in the interlayer insulating layer, in which the first opening exposes a part of the barrier layer, the exposed portion of the barrier layer divides the unexposed barrier layer into a first portion and a second portion that are independent from each other, and both the first portion and the second portion cover the first active layer, and in which the first contact hole penetrates through the interlayer insulating layer and the first portion of the barrier layer and exposes a part of the first active layer, and the second contact hole penetrates through the interlayer insulating layer and the second portion of the barrier layer and exposes a part of the first active layer; and preparing the first gate electrode, the first input electrode, and the first output electrode, in which the first gate electrode contacts the first gate insulating layer through the first opening, the first input electrode contacts the first active layer through the first contact hole, and the first output electrode contacts the first active layer through the second contact hole.

Optionally, after the barrier layer is prepared, an interlayer insulating layer may be formed on a surface of the barrier layer away from the substrate by plasma enhanced chemical vapor deposition. The interlayer insulating layer shall at least completely cover the barrier layer, or cover the entire display substrate, so that the interlayer insulating layer can be simultaneously also used as an interlayer insulating layer of other transistors included in the display substrate. Optionally, after the interlayer insulating layer is formed by deposition, the first opening, the first contact hole, and the second contact hole may be simultaneously formed on the interlayer insulating layer through a single patterning process. The first opening can expose a part of the barrier layer, and the exposed barrier layer can divide the unexposed barrier layer into a first portion and a second portion that are independent from each other. Both the orthogonal projection of the first portion on the substrate and the orthogonal projection of the second portion on the substrate partially overlap the orthogonal projection of the first active layer on the substrate. The first contact hole penetrates through the interlayer insulating layer and the first portion of the barrier layer, to expose a part of the first active layer, and the second contact hole penetrates through the interlayer insulating layer and the second portion of the barrier layer, to expose a part of the first active layer.

After the first opening, the first contact hole, and the second contact hole are formed, a conductive film layer may be deposited on a surface of the interlayer insulating layer away from the substrate. The conductive film layer covers the surface of the interlayer insulating layer away from the substrate, and is filled in the first contact hole, the second contact hole, and the first opening. Then, the conductive film layer is patterned once, to form the first gate electrode, the first input electrode, and the first output electrode simultaneously. The first gate electrode contacts the first gate insulating layer through the first opening, the first input electrode contacts the first active layer through the first contact hole, and the first output electrode contacts the first active layer through the second contact hole.

The above methods for preparing the barrier layer by using a dense insulating material and for preparing the first insulating layer, the first gate electrode, the first input electrode, and the first output electrode not only well avoid the disadvantage of hydrogen on the first active layer, but also reduces the step of forming the first gate insulating layer through the oxidation process when forming the first opening, the first contact hole and the second contact hole in a same patterning process, so that the preparation process of the oxide transistor is more simplified, and the structure of the prepared oxide transistor is simple.

In some embodiments, the above steps of preparing the low-temperature polysilicon transistor may specifically include the following steps.

A second active layer 30 is prepared in the same layer as the first active layer 20; a second gate insulating layer 31 is prepared on a surface of the second active layer 30 away from the substrate 10; and a second gate electrode 32 is prepared on a surface of the second gate insulating layer 31 away from the substrate 10. An orthogonal projection of the second gate electrode 32 on the second active layer 30 divides the second active layer 30 into a third portion and a fourth portion that are independent from each other.

When the interlayer insulating layer 40 is prepared, the interlayer insulating layer 40 is extended to completely cover the second active layer 30.

In the process of preparing the first contact hole and the second contact hole, the third contact hole and the fourth contact hole are prepared simultaneously. The third contact hole exposes at least a part of the third portion, and the fourth contact hole exposes at least a part of the fourth portion.

In the process of preparing the first gate electrode 25, the first input electrode 23, and the first output electrode 24, the second input electrode 33 and the second output electrode 34 are prepared simultaneously. The second input electrode 33 contacts the third portion through the third contact hole, and the second output electrode 34 contacts the fourth portion through the fourth contact hole.

Optionally, when the low-temperature polysilicon transistor is prepared, the second active layer 30 arranged in the same layer as the first active layer 20 may be prepared on the substrate 10 after the first active layer 20 and the barrier layer 21 in the oxide transistor are prepared. The specific preparation process may include: depositing an amorphous silicon film by chemical vapor deposition, converting the amorphous silicon film into a polycrystalline silicon film by laser rapid thermal annealing process, and then patterning the polycrystalline silicon film, to form a second active layer 30.

An insulating material is then used to prepare a second gate insulating layer 31 on the surface of the second active layer 30 away from the substrate 10. Then, a conductive material is used to prepare the second gate electrode 32 on the surface of the second gate insulating layer 31 away from the substrate 10. The second gate electrode 32 and the second active layer 30 are insulated from each other. An orthogonal projection of the second gate electrode 32 on the second active layer 30 may divide the second active layer 30 into the third portion and the fourth portion that are independent from each other.

After the second gate electrode 32 and the second gate insulating layer 31 are prepared, an interlayer insulating layer 40 may be deposited. The interlayer insulating layer 40 can at least cover the second active layer 30 and the barrier layer 21 in the oxide transistor simultaneously. Various materials can be used for the interlayer insulating layer 40. For example, the interlayer insulating layer 40 may include: dielectric materials, such as SiOx, SiNx, SiON; or various new types of organic insulating materials; or high dielectric constant materials, such as AlOx, HfOx, TaOx, etc.

After the interlayer insulating layer 40 is formed, the first contact hole, the second contact hole, the third contact hole, and the fourth contact hole may be simultaneously formed on the interlayer insulating layer 40 by a single patterning process. The third contact hole exposes at least a part of the third portion, and the fourth contact hole exposes at least a part of the fourth portion. Then, a conductive film layer is deposited on a surface of the interlayer insulating layer 40 away from the substrate 10. The conductive film layer covers the surface of the interlayer insulating layer 40 away from the substrate 10, and is filled in the first contact hole, the second contact hole, the first opening, the third contact hole, and the fourth contact hole. Then, the conductive film layer is patterned once, to form the first gate electrode 25, the first input electrode 23, the first output electrode 24, the second input electrode 33, and the second output electrode 34 are simultaneously. The first gate electrode 25 contacts the first gate insulating layer 22 through the first opening, the first input electrode 23 contacts the first active layer 20 through the first contact hole, and the first output electrode 24 contacts the first active layer 20 through the second contact hole, the second input electrode 33 contacts the third portion through the third contact hole, and the second output electrode 34 contacts the fourth portion through the fourth contact hole.

When the method provided in the above embodiment is used to prepare a low-temperature polysilicon transistor, the low-temperature polysilicon transistor and the oxide transistor can be prepared on the same level. This not only reduces the number of stacked display substrates, but also well reduces the internal segment difference of the display substrate and improves display uniformity. In addition, for the bottom emission type display substrate, it is more helpful to improve the display brightness. In addition, the method provided in the above embodiment is used to prepare a low-temperature polysilicon transistor, so that a part of the functional pattern in the low-temperature polysilicon transistor and a part of the functional pattern in the oxide transistor can be simultaneously formed in the same patterning process. This greatly reduces the number of times the mask plate is used for patterning during the preparation of the display substrate, thereby effectively reducing the process flow of preparing the display substrate and reducing the preparation cost of the display substrate.

In addition, when the low-temperature polysilicon transistor and the oxide transistor are prepared by the method provided in the above embodiment, the first gate insulating layer 22 in the oxide transistor is formed after the interlayer insulating layer 40 is prepared, so that all high temperature processes have been completed before the first gate insulating layer 22 in the oxide transistor is formed. This suppresses the diffusion of hydrogen into the first active layer 20 in the oxide transistor.

In some embodiments, the step for preparing the second gate insulating layer 31 and the second gate electrode 32 provided by the above embodiments includes:

forming a second gate insulating thin film;

forming a conductive material thin film on a surface of the second gate insulating thin film away from the substrate 10;

patterning the conductive material thin film to form the second gate electrode 32; and etching the second gate insulating thin film using the second gate electrode 32 as a mask plate, to form the second gate insulating layer 31.

Optionally, when the second gate insulating layer 31 and the second gate electrode 32 are prepared, an insulating material may be used first to deposit a second gate insulating thin film on a surface of the second active layer 30 away from the substrate 10. Next, a conductive material is used to deposit a conductive material thin film on a surface of the second gate insulating away from the substrate 10. Then, a photoresist is formed on a surface of the conductive material thin film away from the substrate 10, and the photoresist is exposed and developed to form a photoresist reserved area and a photoresist removal area. The photoresist reserved area corresponds to the second gate electrode 32, and the photoresist removal area corresponds to the area other than the area in which the second gate electrode 32 is located. Then, the exposed photoresist is developed with a developing solution to remove the photoresist located in the photoresist removal area, and then the conductive material thin film located in the photoresist removal area is etched, to completely remove the conductive material thin film located in the photoresist removal area. Finally, the photoresist located in the photoresist reserved area is completely stripped, and the conductive material thin film located in the photoresist reserved area serves as the second gate electrode 32.

After the second gate electrode 32 is prepared, the second gate electrode 32 can be used as a mask plate to etch the second gate insulating thin film, to remove the second gate insulating thin film not covered by the second gate electrode 32. The rest of the second gate insulating thin film covered by the second gate electrode 32 serves as the second gate insulating layer 31.

In the method provided in the above embodiment, the second gate electrode 32 and the second gate insulating layer 31 are prepared using a self-alignment process. This simplifies the patterning process of the second gate insulating layer 31, effectively reduces the process flow of preparing the display substrate, and reduces the preparation cost of the display substrate.

Figure 1A:
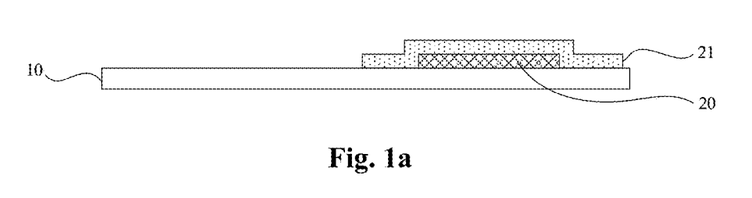
FIGS. 1a to 1d are schematic views showing the display substrate structure prepared according to various steps in the preparation method according to an embodiment of the present disclosure.
Figure 1B:
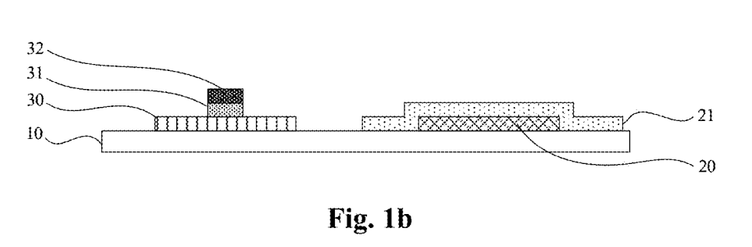
Figure 1C:
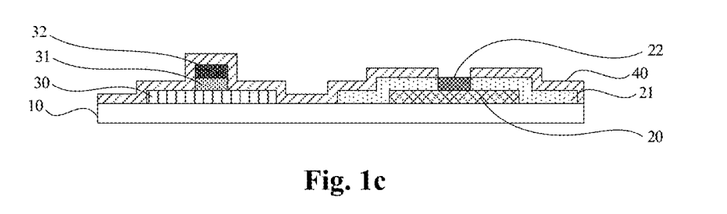
Figure 1D:
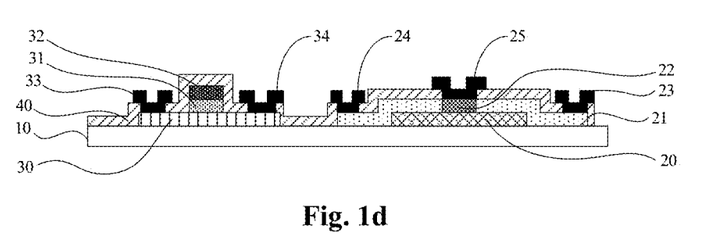
Figure 2:
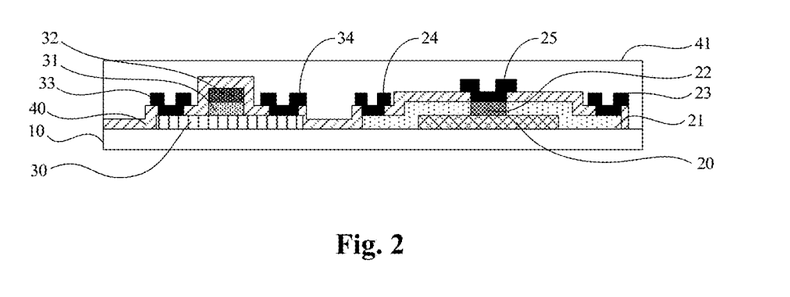
FIG. 2 is a schematic view showing the cross section of the oxide transistor and the low-temperature polysilicon transistor according to an embodiment of the present disclosure.

After the oxide transistor and the low-temperature polysilicon transistor are prepared, aluminum oxide (AlOx) material may continue to be sputtered on a surface of the oxide transistor and the low-temperature polysilicon transistor away from the substrate 10, to form the passivation layer 41. When the electrodes, capacitor plates, and signal lines in the display substrate are prepared, it may use common metal materials, such as Ag, Cu, Al, Mo, etc.; or multilayer metals, such as MoNb/Cu/MoNb, etc.; or alloy materials of the above metals, such as AlNd, MoNb, etc.; or stack structures formed of metals and transparent conductive oxides (such as ITO, AZO, etc.), such as ITO/Ag/ITO, etc. As shown in FIG. 2, when the buffer layer, the gate insulating layer, the interlayer insulating layer 40 (that is, the interlayer dielectric layer) and the passivation layer 41 in the display substrate are prepared, it may use conventional dielectric materials, such as SiOx, SiNx, SiON, etc.; or various new types of organic insulating materials; or high dielectric constant materials, such as AlOx, HfOx, TaOx, etc. After the pixel driving circuit in the display substrate is prepared, a planarization layer is generally prepared on a surface of the pixel driving circuit away from the substrate 10. An organic insulating dielectric material can be used to prepare the planarization layer. For example, the organic insulating dielectric material includes, but is not limited to, polysiloxane-based materials, acrylic-based materials, polyimide-based materials, and the like.

In the method for preparing the display substrate provided by the above embodiments, the top gate electrode structure mainly including the oxide transistor and the low-temperature polysilicon transistor is use for illustrative purpose, but it is not limited to this.

An embodiment of the present disclosure also provides a display substrate prepared by the method of the display substrate according to the above embodiment. The display substrate includes a substrate 10 and a pixel driving circuit arranged on the substrate 10, the pixel driving circuit including an oxide transistor and a low-temperature polysilicon transistor. The oxide transistor includes a first active layer 20, a first gate insulating layer 22, a first gate electrode 25, a first input electrode 23, a first output electrode 24, and a barrier layer 21 arranged on a surface of the first active layer 20 away from the substrate 10. An orthogonal projection of the barrier layer 21 on the substrate 10 covers an orthogonal projection of the first active layer 20 on the substrate 10.

There are various types of substrates 10 selected for the above display substrate. For example, a glass substrate 10 may be selected, and a film layer such as a buffer film layer may be prepared on the substrate 10 before the first active layer 20 is prepared on the substrate 10. When the first active layer 20 is prepared on the substrate 10, an active thin film may be first deposited using indium gallium zinc oxide (IGZO), and then the active thin film is patterned to form the first active layer 20. After the first active layer 20 is prepared, a barrier layer 21 is prepared on a surface of the first active layer 20 away from the substrate 10, so that the barrier layer 21 can completely cover the first active layer 20, i.e., cover the top surface and the side surface of the first active layer 20, to prevent hydrogen from diffusing into the first active layer 20 in the subsequent high-temperature process.

After the barrier layer 21 is prepared, the rest part of the low-temperature polysilicon transistor and the oxide transistor can be continuously prepared. Specifically, after the barrier layer 21 is prepared, a low-temperature polysilicon transistor may be prepared first, and then the first gate insulating layer 22, the first gate electrode 25, the first input electrode 23, and the first output electrode 24 of the oxide transistor are prepared. Optionally, after the barrier layer 21 is prepared, a part of the low-temperature polysilicon transistor may be prepared first, and then the rest part of the low-temperature polysilicon transistor as well as the first gate insulating layer 22, the first gate electrode 25, the first input electrode 23 and the first output electrode 24 of the oxide transistor may be prepared simultaneously.

The first gate insulating layer 22 and the first gate electrode 25 included in the oxide transistor may also be prepared before the first active layer 20 layer and the barrier layer 21 are prepared. The first input electrode 23 and the first output electrode 24 included in the oxide transistor may be prepared after the first active layer 20 and the barrier layer 21 are prepared.

In the method for preparing the display substrate according to an embodiment of the present disclosure, the first active layer 20 of the oxide transistor is prepared first, a barrier layer 21 is prepared on the first active layer 20 of the oxide transistor, and then a low-temperature polysilicon transistor is prepared. This prevents the hydrogen introduced during the preparation of the low-temperature polysilicon transistor from diffusing into the first active layer 20 of the oxide transistor in a high-temperature process, and avoids the hydrogen from adversely affecting the active layer in the metal oxide transistor, thereby well ensuring the reliability of the prepared display substrate.

In some embodiments, the oxide transistor provided in the above embodiments further includes an interlayer insulating layer 40 completely covering the barrier layer 21. The interlayer insulating layer 40 is provided with a first opening. An orthogonal projection of the first opening on the substrate 10 overlaps an orthogonal projection of the partial barrier layer 21 on the substrate 10. The part of the barrier layer 21 divides the rest barrier layer 21 into a first portion and a second portion that are independent from each other. Both the first portion and the second portion cover a part of the first active layer 20. The partial barrier layer 21 includes a metal oxide pattern and can serve as the first gate insulating layer 22, and the rest barrier layer 21 includes a metal pattern.

The interlayer insulating layer 40 is also provided with a first contact hole and a second contact hole. An orthogonal projection of the first contact hole on the substrate 10 overlaps an orthogonal projection of at least a part of the first portion on the substrate 10, and an orthogonal projection of the second contact hole on the substrate 10 overlaps an orthogonal projection of at least a part of the second portion on the substrate 10.

The first gate electrode 25 contacts the first gate insulating layer 22 through the first opening, the first input electrode 23 contacts the first portion through the first contact hole, and the first output electrode 24 contacts the second portion through the second contact hole.

Optionally, the barrier layer 21 may be made of a metal material. Optionally, the metal material used is a metal material that is easy to be oxidized, so as to facilitate subsequent preparation of the first gate insulating layer 22. For example, the metal materials used include metals that are easily to be oxidized, such as aluminum (Al), hafnium (Ha), and tantalum (Ta). When the barrier layer 21 is made of a metal material, a metal thin film may be deposited on a surface of the first active layer 20 away from the substrate 10, and then the metal thin film is patterned using a mask plate, to form the barrier layer 21.

After the barrier layer 21 is prepared, an interlayer insulating layer 40 may be formed on a surface of the barrier layer 21 away from the substrate 10 by plasma enhanced chemical vapor deposition. The interlayer insulating layer 40 should at least completely cover the barrier layer 21. Optionally, the interlayer insulating layer 40 covers the entire display substrate, so that it can be also used as the interlayer insulating layer 40 of other transistors included in the display substrate at the same time. After the interlayer insulating layer 40 is formed by deposition, the interlayer insulating layer 40 may be patterned, to form a first opening in the interlayer insulating layer 40. The first opening can expose a part of the barrier layer 21, and the exposed barrier layer 21 can divide the unexposed barrier layer 21 into a first portion and a second portion that are independent from each other. Both the orthogonal projection of the first portion on the substrate 10 and the orthogonal projection of the second portion on the substrate 10 partially overlap the orthogonal projection of the first active layer 20 on the substrate 10.

After the first opening is formed on the interlayer insulating layer 40, the exposed barrier layer 21 may be oxidized through the first opening, so that the exposed barrier layer 21 is changed from a metal material to a metal oxide material. The part of the metal oxide material may be used as the first gate insulating layer 22 in the oxide transistor. The above oxidation specific process may be selected from oxygen ion bombardment, anodization and other oxidation processes, but it is not limited thereto.

Then, it may continue to form the first contact hole and the second contact hole in the interlayer insulating layer 40. Both the first contact hole and the second contact hole can penetrate through the interlayer insulating layer 40, the first contact hole exposes at least a part of the first portion, and the second contact hole exposes at least a part of the second portion. Then, it may continue to prepare the first gate electrode 25, the first input electrode 23, and the first output electrode 24. For example, a conductive film layer may be deposited on a surface of the interlayer insulating layer 40 away from the substrate 10 first. The conductive film layer covers the surface of the interlayer insulating layer 40 away from the substrate 10, and is filled in the first contact hole, the second contact hole, and the first opening. Then, the conductive film layer is patterned once, to form the first gate electrode 25, the first input electrode 23, and the first output electrode 24 simultaneously. The first gate electrode 25 can contact the first gate insulating layer 22 through the first opening, the first input electrode 23 can contact the first portion through the first contact hole, and the first output electrode 24 can contact the second portion through the second contact hole.

The display substrate of the above structure not only avoids the adverse influence of hydrogen on the first active layer 20, but also simplifies the process flow for preparing the oxide transistor and makes the structure of the prepared oxide transistor simple.

In some other embodiments, the oxide transistor provided in the above embodiments further includes an interlayer insulating layer completely covering the barrier layer. A first opening is arranged in the interlayer insulating layer, and an orthogonal projection of the first opening on the substrate overlaps an orthogonal projection of the partial barrier layer on the substrate. The part of the barrier layer divides the rest barrier layer into a first portion and a second portion that are independent from each other. Both the first portion and the second portion cover a part of the first active layer. The barrier layer includes a dense insulating pattern, and can serve as a first gate insulating layer.

The interlayer insulating layer is also provided with a first contact hole and a second contact hole. The first contact hole penetrates through the interlayer insulating layer and the first portion of the barrier layer, and the second contact hole penetrates through the interlayer insulating layer and the second portion of the barrier layer.

The first gate electrode contacts the first gate insulating layer through the first opening. The first input electrode contacts the first active layer through the first contact hole. The first output electrode contacts the first active layer through the second contact hole.

Specifically, an insulating material with a preset density can be used to prepare the barrier layer, and the preset density can be selected according to actual needs, as long as it can block the passage of hydrogen. For example, the density of the insulating material for preparing the barrier layer is 0.5 or more, and may be 0.6 or more, 0.65 or more, 0.70 or more, or 0.75 or more. Materials, such as silicon oxide and silicon nitride, can be used to make the barrier layer. When the above insulating material is used to prepare the barrier layer, an insulating thin film may be deposited on a surface of the first active layer away from the substrate, and then the insulating thin film may be patterned using a mask plate, to form the barrier layer. Since the barrier layer covers the first active layer and has insulating properties, the barrier layer can be directly reused as the first gate insulating layer.

After the barrier layer is prepared, an interlayer insulating layer may be formed on a surface of the barrier layer away from the substrate by plasma enhanced chemical vapor deposition. The interlayer insulating layer shall at least completely cover the barrier layer, or may cover the entire display substrate, so that it can be simultaneously also used as an interlayer insulating layer of other transistors included in the display substrate. After the interlayer insulating layer is formed by deposition, the first opening, the first contact hole, and the second contact hole may be simultaneously formed on the interlayer insulating layer through a single patterning process. The first opening can expose a part of the barrier layer, and the exposed barrier layer can divide the unexposed barrier layer into a first portion and a second portion that are independent from each other. Both the orthogonal projection of the first portion on the substrate and the orthogonal projection of the second portion on the substrate partially overlap the orthogonal projection of the first active layer on the substrate. The first contact hole penetrates through the interlayer insulating layer and the first portion of the barrier layer, to expose a part of the first active layer. The second contact hole penetrates through the interlayer insulating layer and the second portion of the barrier layer, to expose a part of the first active layer.

After the first opening, the first contact hole, and the second contact hole are formed, a conductive film layer may be deposited on a surface of the interlayer insulating layer away from the substrate. The conductive film layer covers the surface of the interlayer insulating layer away from the substrate, and is filled in the first contact hole, the second contact hole, and the first opening. Then, the conductive film layer is patterned once, to form the first gate electrode, the first input electrode, and the first output electrode simultaneously. The first gate electrode contacts the first gate insulating layer through the first opening, the first input electrode contacts the first active layer through the first contact hole, and the first output electrode contacts the first active layer through the second contact hole.

The display substrate of the above structure not only avoids the disadvantage of hydrogen on the first active layer, but also reduces the step of forming the first gate insulating layer through the oxidation process when forming the first opening, the first contact hole and the second contact hole in a same patterning process. These simplify the process flow for preparing the oxide transistor and make the structure of the prepared oxide transistor simple.

The low-temperature polysilicon transistor provided in the above embodiment may include: a second active layer 30 arranged in the same layer as the first active layer 20; a second gate insulating layer 31 arranged on a surface of the second active layer 30 away from the substrate 10; and a second gate electrode 32 arranged on a surface of the second gate insulating layer 31 away from the substrate 10, in which an orthogonal projection of the second gate electrode 32 on the second active layer 30 divides the second active layer 30 into a third portion and a fourth portion that are independent from each other; a interlayer insulating layer extending from the interlayer insulating layer 40 to completely covering the second active layer 30, in which the interlayer insulating layer 40 is also provided with a third contact hole and a fourth contact hole, an orthogonal projection of the third contact hole on the substrate 10 overlapping an orthogonal projection of at least a part of the third portion on the substrate 10, and an orthogonal projection of the fourth contact hole on the substrate 10 overlapping an orthogonal projection of at least a part of the fourth portion on the substrate 10; and the second input electrode 33 and the second output electrode 34, in which the second input electrode 33 contacts the third portion through the third contact hole, and the second output electrode 34 contacts the fourth portion through the fourth contact hole.

When the low-temperature polysilicon transistor is prepared, the second active layer 30 arranged in the same layer as the first active layer 20 is prepared on the substrate 10 after the first active layer 20 and the barrier layer 21 in the oxide transistor are prepared. The specific preparation process may include: depositing an amorphous silicon film by chemical vapor deposition, converting the amorphous silicon film into a polycrystalline silicon film by laser rapid thermal annealing process, and then patterning the polycrystalline silicon film, to form a second active layer 30.

Then, an insulating material is used to prepare the second gate insulating layer 31 on the surface of the second active layer 30 away from the substrate 10, and then a conductive material is used to prepare the second gate electrode 32 on a surface of the second gate insulating layer 31 away from the substrate 10. The second gate electrode 32 and the second active layer 30 are insulated from each other. An orthogonal projection of the second gate electrode 32 on the second active layer 30 can divide the second active layer 30 into a third portion and a fourth portion that are independent from each other.

After the second gate electrode 32 and the second gate insulating layer 31 are prepared, an interlayer insulating layer 40 may be deposited. The interlayer insulating layer 40 can at least cover the second active layer 30 and the barrier layer 21 in the oxide transistor simultaneously. Various materials can be used for the interlayer insulating layer 40. For example, materials that can be used for the interlayer insulating layer 40 include: dielectric materials, such as SiOx, SiNx, and SiON; or various new organic insulating materials; or high dielectric constant materials, such as AlOx, HfOx, TaOx, etc.

After the interlayer insulating layer 40 is formed, the first contact hole, the second contact hole, the third contact hole, and the fourth contact hole may be simultaneously formed on the interlayer insulating layer 40 by a single patterning process. The third contact hole exposes at least a part of the third portion, and the fourth contact hole exposes at least a part of the fourth portion. Then, a conductive film layer is deposited on a surface of the interlayer insulating layer 40 away from the substrate 10. The conductive film layer covers the surface of the interlayer insulating layer 40 away from the substrate 10, and is filled in the first contact hole, the second contact hole, the first opening, the third contact hole, and the fourth contact hole. Then, the conductive film layer is patterned once, to form the first gate electrode 25, the first input electrode 23, the first output electrode 24, the second input electrode 33, and the second output electrode 34 are simultaneously. The first gate electrode 25 contacts the first gate insulating layer 22 through the first opening, the first input electrode 23 contacts the first active layer 20 through the first contact hole, and the first output electrode 24 contacts the first active layer 20 through the second contact hole, the second input electrode 33 contacts the third portion through the third contact hole, and the second output electrode 34 contacts the fourth portion through the fourth contact hole.

When the low-temperature polysilicon transistor with the above structure is used in the display substrate, the low-temperature polysilicon transistor and the oxide transistor can be arranged on the same level. This not only reduces the number of stacked layers of the display substrate, reduces the internal segment difference of the display substrate, and improves the display uniformity; but also be more helpful to improve the display brightness for the bottom emission type display substrate. In addition, when the low-temperature polysilicon transistor with the above structure is used in the display substrate, a part of the functional pattern in the low-temperature polysilicon transistor and a part of the functional pattern in the oxide transistor can be simultaneously formed in the same patterning process. This reduces the number of times that the mask plate is used for patterning during the preparation of the display substrate, thereby effectively reducing the process flow of preparing the display substrate and reducing the preparation cost of the display substrate.

In addition, when the low-temperature polysilicon transistor with the above structure is used in the display substrate, the first gate insulating layer 22 in the oxide transistor is formed after the interlayer insulating layer 40 is prepared, so that all high temperature processes have been completed before the first gate insulating layer 22 in the oxide transistor is formed. This suppresses the adverse effects caused by the diffusion of hydrogen into the first active layer 20 of the oxide transistor.

In some embodiments, an orthogonal projection of the second gate insulating layer 31 on the substrate 10 may coincide with an orthogonal projection of the second gate electrode 32 on the substrate 10. When the second gate insulating layer 31 and the second gate electrode 32 are prepared, an insulating material may be used first to deposit a second gate insulating thin film on a surface of the second active layer 30 away from the substrate 10. Next, a conductive material is used to deposit a conductive material thin film on a surface of the second gate insulating away from the substrate 10. Then, a photoresist is formed on a surface of the conductive material thin film away from the substrate 10, and the photoresist is exposed and developed to form a photoresist reserved area and a photoresist removal area. The photoresist reserved area corresponds to the second gate electrode 32, and the photoresist removal area corresponds to the area other than the area in which the second gate electrode 32 is located. Then, the exposed photoresist is developed with a developing solution to remove the photoresist located in the photoresist removal area, and then the conductive material thin film located in the photoresist removal area is etched, to completely remove the conductive material thin film located in the photoresist removal area. Finally, the photoresist located in the photoresist reserved area is completely stripped, and the conductive material thin film located in the photoresist reserved area serves as the second gate electrode 32.

After the second gate electrode 32 is prepared, the second gate electrode 32 can be used as a mask plate to etch the second gate insulating thin film, to remove the second gate insulating thin film not covered by the second gate electrode 32. The rest of the second gate insulating thin film covered by the second gate electrode 32 serves as the second gate insulating layer 31.

When the orthogonal projection of the second gate insulating layer 31 on the substrate 10 coincides with the orthogonal projection of the second gate electrode 32 on the substrate 10, the second gate electrode 32 and the second gate electrode insulating layer 31 may be prepared by self-alignment process. This simplifies the patterning process of the second gate insulating layer 31, effectively reduces the process flow of preparing the display substrate, and reduces the preparation cost of the display substrate.

In the display substrate provided by the above embodiment, the specific structure of the pixel driving circuit may be set according to actual needs. For example, the pixel driving circuit includes a plurality of transistors, including a switching transistor having a switching function and a driving transistor having a driving function. In some embodiments, the low-temperature polysilicon transistor may be used as a driving transistor in the pixel driving circuit, and the oxide transistor is used as a switching transistor in the pixel driving circuit.

Figure 3:
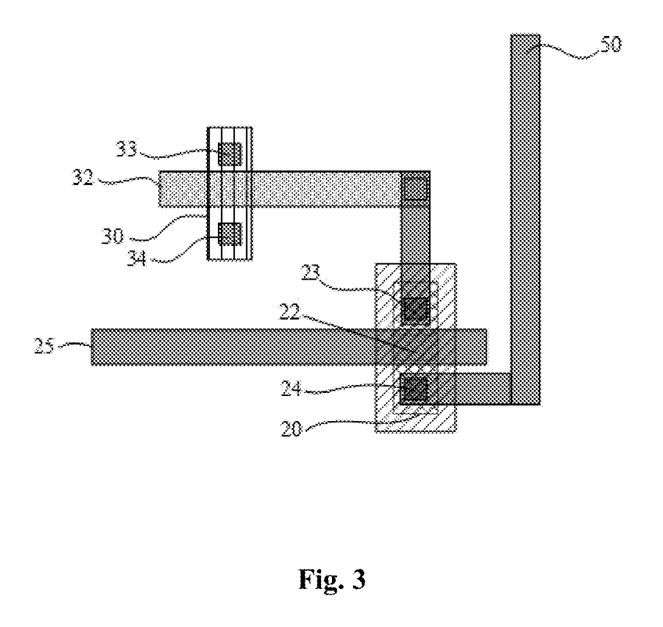
FIG. 3 is a top view showing the oxide transistor and the low-temperature polysilicon transistor according to an embodiment of the present disclosure.

As shown in FIG. 3, when the low-temperature polysilicon transistor is used as a driving transistor in the pixel driving circuit and the oxide transistor is used as a switching transistor for inputting a data signal in the pixel driving circuit, the first input electrode 34 of the oxide transistor can be connected to the data signal line 50 of the display substrate, and the first output electrode 33 of the oxide transistor may be connected to the second gate electrode 25 of the low-temperature polysilicon transistor.

Due to the high mobility of low-temperature polysilicon thin-film transistors, which can accelerate the charging speed of the pixel capacitor, metal oxide thin-film transistors have lower leakage currents, so the use of low-temperature polysilicon transistors as drive transistors in pixel driving circuits and oxide transistors as switching transistors in pixel driving circuit can realize the combination of the advantages of these two transistors, thereby helping to improve the resolution of the display substrate and the quality of the display image quality, and further reduce power consumption.

One embodiment of the present disclosure further provides a display device including the display substrate provided by the above embodiment.

The display substrate provided by the above embodiment can avoid the adverse effect of hydrogen on the active layer in the metal oxide transistor, which ensures the reliability of the prepared display substrate; meanwhile, also has advantages of a simple structure, a simple preparation process, and low preparation cost, achieving high resolution, high display quality, and better power consumption reduction. Therefore, the display device provided by the embodiment of the present disclosure, which also has the display substrate provided by the above embodiment, also has the above advantages, which will not be repeated herein.

Optionally, the display device may include any product or component having a display function, such as a television, a display, a digital photo frame, a mobile phone, and a tablet computer.

Each embodiment in the present specification are described in a progressive manner, and the same or similar parts among the various examples may be referred to each other, and each embodiment focuses on differences from other embodiments. In particular, as for the product embodiments, since they are basically similar to the method embodiments, the description thereof is relatively simple, and the relevant parts may be referred to description of the product embodiments.

Unless otherwise defined, technical terms or scientific terms used herein have the normal meaning commonly understood by one skilled in the art in the field of the present disclosure. The words "first", "second", and the like used herein does not denote any order, quantity, or importance, but rather merely serves to distinguish different components. The "including", "comprising", and the like used in the present disclosure means that the element or item appeared in front of the word encompasses the element or item and their equivalents listed after the word, and does exclude other elements or items. The word "connected" or "connecting" and the like are not limited to physical or mechanical connections, but may include electrical connections, whether direct or indirect. "On", "under", "left", "right" and the like are only used to represent relative positional relationships, and when the absolute position of the described object is changed, the relative positional relationship may also be changed, accordingly.

It will be understood that when an element, such as a layer, film, region, or substrate, is referred to as being "on" or "under" another element, the element may be directly "on" or "under" another element, or there may be an intermediate element.

In the description of the above embodiments, the specific features, structures, materials or features may be combined in any suitable manner in any one or more embodiments or examples.

The above description is merely the optional embodiment of the present disclosure, but the scope of the present disclosure is not limited thereto. Moreover, any person skilled in the art would readily conceive of modifications or substitutions within the technical scope of the present disclosure, and these modifications or substitutions shall also fall within the protection scope of the present disclosure. Therefore, the protection scope of the present disclosure should be determined by the scope of the claims.

What is claimed is:

1. A method for preparing a display substrate, comprising a step of preparing a pixel driving circuit on a substrate, the pixel driving circuit comprising an oxide transistor and a low-temperature polysilicon transistor,
wherein the step of preparing the pixel driving circuit on the substrate comprises:
preparing a first active layer of the oxide transistor on the substrate;
preparing a barrier layer using a metal material on a surface of the first active layer away from the substrate, wherein an orthogonal projection of the barrier layer on the substrate covers an orthogonal projection of the first active layer on the substrate;
preparing the low-temperature polysilicon transistor on the substrate;
preparing an interlayer insulating layer completely covering the barrier layer on a surface of the barrier layer away from the substrate;
forming a first opening for exposing a part of the barrier layer on the interlayer insulating layer, wherein the exposed barrier layer divides the unexposed barrier layer into a first portion and a second portion that are independent from each other, and the first portion and the second portion both cover a part of the first active layer;
oxidizing the exposed barrier layer to form the first gate insulating layer from the exposed barrier layer;
forming a first contact hole and a second contact hole in the interlayer insulating layer, wherein the first contact hole exposes at least a part of the first portion, and the second contact hole exposes at least a part of the second portion; and
preparing the first gate electrode, the first input electrode, and the first output electrode, wherein the first gate electrode contacts the first gate insulating layer through the first opening, the first input electrode contacts the first portion through the first contact hole, and the first output electrode contacts the second portion through the second contact hole,
wherein the preparing the low-temperature polysilicon transistor on the substrate comprises:
preparing a second active layer arranged in a same layer as the first active layer;
preparing a second gate insulating layer on a surface of the second active layer away from the substrate, and preparing a second gate electrode on a surface of the second gate insulating layer away from the substrate, wherein an orthogonal projection of the second gate electrode on the second active layer divides the second active layer into a third portion and a fourth portion that are independent from each other;
extending the interlayer insulating layer to completely cover the second active layer when preparing the interlayer insulating layer;
simultaneously preparing the third contact hole and the fourth contact hole in the process of preparing the first contact hole and the second contact hole, wherein the third contact hole exposes at least a part of the third portion, and the fourth contact hole exposes at least a part of the fourth portion;

simultaneously preparing the second input electrode and the second output electrode in the process of preparing the first gate electrode, the first input electrode, and the first output electrode, wherein the second input electrode contacts the third portion through the third contact hole, and the second output electrode contacts the fourth portion through the fourth contact hole.

2. The method of claim 1, wherein the barrier layer and the substrate together enclose the first active layer.

3. The method of claim 1, wherein the step of preparing the second gate insulating layer and the second gate electrode comprises:
forming a second gate insulating thin film;
forming a conductive material thin film on a surface of the second gate insulating thin film away from the substrate;
patterning the conductive material thin film to form the second gate electrode; and
etching the second gate insulating thin film using the second gate electrode as a mask plate, to form the second gate insulating layer.

4. A display substrate comprising a substrate and a pixel driving circuit arranged on the substrate, the pixel driving circuit comprising an oxide transistor and a low-temperature polysilicon transistor;
wherein the oxide transistor comprises a first active layer, a first gate insulating layer, a first gate electrode, a first input electrode, a first output electrode, a barrier layer arranged on a surface of the first active layer away from the substrate, and an interlayer insulating layer completely covering the barrier layer, and an orthogonal projection of the barrier layer on the substrate covers an orthogonal projection of the first active layer on the substrate,
wherein the interlayer insulating layer is provided with a first opening, an orthogonal projection of the first opening on the substrate overlaps with an orthogonal projection of a part of the barrier layer on the substrate, the part of the barrier layer divides the rest of the barrier layer into a first portion and a second portion that are independent from each other, both the first portion and the second portion cover a part of the first active layer, and the part of the barrier layer comprises a metal oxide pattern, and is capable of being reused as the first gate insulating layer, and the rest of the barrier layers comprises a metal pattern;
wherein a first contact hole and a second contact hole are further arranged in the interlayer insulating layer, an orthogonal projection of the first contact hole on the substrate overlaps an orthogonal projection of at least a part of the first portion on the substrate, an orthogonal projection of the second contact hole on the substrate overlap an orthogonal projection of at least a part of the second portion on the substrate;
wherein the first gate electrode contacts the first gate insulating layer through the first opening, the first input electrode contacts the first portion through the first contact hole, and the first output electrode contacts the second portion through the second contact hole.

5. The display substrate of claim 4, wherein the barrier layer, the gate insulating layer, and the substrate together enclose the first active layer.

6. The display substrate of claim 4, wherein the low-temperature polysilicon transistor comprises:
a second active layer arranged in a same layer as the first active layer;
a second gate insulating layer arranged on a surface of the second active layer away from the substrate;
a second gate electrode arranged on a surface of the second gate insulating layer away from the substrate, wherein an orthogonal projection of the second gate electrode on the second active layer divides the second active layer into a third portion and a fourth portion that are independent from each other;
an interlayer insulating layer extending from the interlayer insulating layer to completely cover the second active layer, wherein a third contact hole and a fourth contact hole are further arranged in the interlayer insulating layer, an orthogonal projection of the third contact hole on the substrate overlaps an orthogonal projection of at least a part of the third portion on the substrate, an orthogonal projection of the fourth contact hole on the substrate overlap an orthogonal projection of at least a part of the fourth portion on the substrate; and
a second input electrode and a second output electrode, wherein the second input electrode contacts the third portion through the third contact hole, and the second output electrode contacts the fourth portion through the fourth contact hole.

7. The display substrate of claim 6, wherein an orthogonal projection of the second gate insulating layer on the substrate coincides with an orthogonal projection of the second gate electrode on the substrate.

8. The display substrate of claim 4, wherein the low-temperature polysilicon transistor is used as a driving transistor in the pixel driving circuit, and the oxide transistor is used as a switching transistor in the pixel driving circuit.

9. A display device comprising the display substrate of claim 4.

10. The display device of claim 9, wherein the barrier layer, the gate insulating layer, and the substrate together enclose the first active layer.

11. A method for preparing a display substrate, comprising a step of preparing a pixel driving circuit on a substrate, the pixel driving circuit comprising an oxide transistor and a low-temperature polysilicon transistor,
wherein the step of preparing the pixel driving circuit on the substrate comprises:
preparing a first active layer of the oxide transistor on the substrate;
preparing a barrier layer using a dense insulating material on a surface of the first active layer away from the substrate, wherein an orthogonal projection of the barrier layer on the substrate covers an orthogonal projection of the first active layer on the substrate, and the barrier layer is reused as the first gate insulating layer;
preparing the low-temperature polysilicon transistor on the substrate;
preparing an interlayer insulating layer completely covering the barrier layer on a surface of the barrier layer away from the substrate;
forming a first opening, a first contact hole, and a second contact hole in the interlayer insulating layer, wherein the first opening exposes a part of the barrier layer, the exposed part of the barrier layer divides the unexposed barrier layer into a first portion and a second portion that are independent from each other, and both the first portion and the second portion cover the first active layer, and wherein the first contact hole penetrates through the interlayer insulating layer and the first portion of the barrier layer and exposes a part of the first active layer, and the second contact hole penetrates through the interlayer insulating layer and the second portion of the barrier layer and exposes a part of the first active layer; and preparing the first gate electrode, the first input electrode, and the first output electrode, wherein the first gate electrode contacts the first gate insulating layer through the first opening, the first input electrode contacts the first active layer through the first contact hole, and the first output electrode contacts the first active layer through the second contact hole.

12. The method of claim 11, wherein the barrier layer and the substrate together enclose the first active layer.

13. The method of claim 11, wherein the preparing the low-temperature polysilicon transistor on the substrate comprises:

preparing a second active layer arranged in a same layer as the first active layer;

preparing a second gate insulating layer on a surface of the second active layer away from the substrate, and preparing a second gate electrode on a surface of the second gate insulating layer away from the substrate, wherein an orthogonal projection of the second gate electrode on the second active layer divides the second active layer into a third portion and a fourth portion that are independent from each other;

extending the interlayer insulating layer to completely cover the second active layer when preparing the interlayer insulating layer;

simultaneously preparing the third contact hole and the fourth contact hole in the process of preparing the first contact hole and the second contact hole, wherein the third contact hole exposes at least a part of the third portion, and the fourth contact hole exposes at least a part of the fourth portion;

simultaneously preparing the second input electrode and the second output electrode in the process of preparing the first gate electrode, the first input electrode, and the first output electrode, wherein the second input electrode contacts the third portion through the third contact hole, and the second output electrode contacts the fourth portion through the fourth contact hole.

14. The method of claim 13, wherein the step of preparing the second gate insulating layer and the second gate electrode comprises:

forming a second gate insulating thin film;

forming a conductive material thin film on a surface of the second gate insulating thin film away from the substrate;

patterning the conductive material thin film to form the second gate electrode; and etching the second gate insulating thin film using the second gate electrode as a mask plate, to form the second gate insulating layer.

15. A display substrate prepared by the method of claim 11, comprising a substrate and a pixel driving circuit arranged on the substrate, the pixel driving circuit comprising an oxide transistor and a low-temperature polysilicon transistor;

wherein the oxide transistor comprises a first active layer, a first gate insulating layer, a first gate electrode, a first input electrode, a first output electrode, a barrier layer arranged on a surface of the first active layer away from the substrate, and an interlayer insulating layer completely covering the barrier layer, and an orthogonal projection of the barrier layer on the substrate covers an orthogonal projection of the first active layer on the substrate, wherein the interlayer insulating layer is provided with a first opening, an orthogonal projection of the first opening on the substrate overlaps with an orthogonal projection of a part of the barrier layer on the substrate, the part of the barrier layer divides the rest of the barrier layer into a first portion and a second portion that are independent from each other, both the first portion and the second portion cover a part of the first active layer, and the barrier layer comprises a dense insulating pattern, and is capable of being reused as the first gate insulating layer;

wherein a first contact hole and a second contact hole are further arranged in the interlayer insulating layer, the first contact hole penetrates through the interlayer insulating layer and the first portion of the barrier layer, and the second contact hole penetrates through the interlayer insulating layer and the second portion of the barrier layer;

wherein the first gate electrode contacts the first gate insulating layer through the first opening, the first input electrode contacts the first active layer through the first contact hole, and the first output electrode contacts the first active layer through the second contact hole.

16. The display substrate of claim 15, wherein the barrier layer, the gate insulating layer, and the substrate together enclose the first active layer.

17. The display substrate of claim 15, wherein the low-temperature polysilicon transistor comprises:

a second active layer arranged in a same layer as the first active layer;

a second gate insulating layer arranged on a surface of the second active layer away from the substrate;

a second gate electrode arranged on a surface of the second gate insulating layer away from the substrate, wherein an orthogonal projection of the second gate electrode on the second active layer divides the second active layer into a third portion and a fourth portion that are independent from each other;

an interlayer insulating layer extending from the interlayer insulating layer to completely cover the second active layer, wherein a third contact hole and a fourth contact hole are further arranged in the interlayer insulating layer, an orthogonal projection of the third contact hole on the substrate overlaps an orthogonal projection of at least a part of the third portion on the substrate, an orthogonal projection of the fourth contact hole on the substrate overlap an orthogonal projection of at least a part of the fourth portion on the substrate; and a second input electrode and a second output electrode, wherein the second input electrode contacts the third portion through the third contact hole, and the second output electrode contacts the fourth portion through the fourth contact hole.

18. The display substrate of claim 17, wherein an orthogonal projection of the second gate insulating layer on the substrate coincides with an orthogonal projection of the second gate electrode on the substrate.

19. A display device comprising the display substrate of claim 15.

20. The display device of claim 19, wherein the barrier layer, the gate insulating layer, and the substrate together enclose the first active layer.

* * * * *